United States Patent [19]

Turner

[11] 4,353,161

[45] Oct. 12, 1982

[54] PROCESS FOR FABRICATING SOLAR TO ELECTRICAL ENERGY CONVERSION UNITS

[75] Inventor: Gary B. Turner, Canoga Park, Calif.

[73] Assignee: Atlantic Richfield Company, Los Angeles, Calif.

[21] Appl. No.: 274,961

[22] Filed: Jun. 18, 1981

[51] Int. Cl.³ .......................................... H01L 31/18
[52] U.S. Cl. .................................... 29/572; 29/574; 136/244; 136/290
[58] Field of Search .................. 29/572, 574; 136/244, 136/290

[56] References Cited

U.S. PATENT DOCUMENTS

| 3,630,627 | 12/1971 | Cable | 356/222 |
| 4,129,823 | 12/1978 | van der Pool et al. | 324/20 R |
| 4,149,665 | 4/1979 | Costogue et al. | 228/5.1 |
| 4,301,409 | 11/1981 | Miller et al. | 324/158 D |

OTHER PUBLICATIONS

K. Emery et al, "Automated Electronic Analysis of Solar Cells", *Conf. Record, 14th IEEE Photovoltaic Specialists Conf.* (1980), pp. 506–510.

*Primary Examiner*—Aaron Weisstuch
*Attorney, Agent, or Firm*—Nilsson, Robbins, Dalgarn, Berliner, Carson & Wurst

[57] ABSTRACT

A process for fabricating solar to electrical energy conversion units, includes the forming of arrays of parallel-connected strings of series connected solar cells selected from a number of different categories of cells. The categories are defined by different ranges of cell currents at a set cell voltage, a set level of incident cell face radiation and a set temperature. Each string of an array consists of cells from the same category; but strings of cells from different categories are used in the same array. A goal array current range for the arrays may be correlated with the average current of a group of cells at the set conditions, or with the estimated average for a group of cells to be manufactured, so that a selected number of strings for the arrays multiplied by such average falls within the range. According to a particular fabricating process, nine solar cell categories covering a total of approximately 0.9 amperes are established to form arrays of six parallel-connected strings of eleven series-connected solar cells having a goal array current range of 12.95 amperes plus or minus 2.2 percent. According to this particular process, hundreds of string combinations are possible, including combinations having strings from the lowest and highest categories.

14 Claims, 6 Drawing Figures

PROCESS FOR FABRICATING SOLAR TO ELECTRICAL ENERGY CONVERSION UNITS

BACKGROUND OF THE INVENTION

Traditionally, as they are manufactured, solar cells are tested for their current at a given voltage across the cell, a given level of solar radiation incident upon the face of the cell and a given temperature. Then, they are separated according to their tested currents.

Typically, in forming arrays from such manufactured solar cells, e.g., during the process of constructing solar panels, solar cells which have been separated into one of a number of current ranges are then included in a particular panel.

By way of example, each cell of the yield of P/N junction solar cells from a conventional manufacturing process might be tested at a voltage near the expected maximum power point for such cells, at a level of solar radiation incident on the cell face of 1 kilowatt/-(meter)$^2$ (1 sun of insolation) and at a temperature for the solar cell environment, and thus, for the cell, of 28 degrees centigrade (approximating room temperature). The maximum power point for a cell at a given level of incident solar radiation and temperature, of course, is the point of maximum voltage multiplied by current along the voltage versus current curve for that cell under those conditions.

Upon such a testing of a large group of solar cells manufactured at about the same time, with certain highly atypical (though perhaps excellent) and extremely poor cells being subsequently eliminated, a distribution of currents, tested in the fashion indicated, for the remaining group, is expected. The distribution, for example, might cover a range of about one ampere. An average test current for such a remaining group of solar cells can readily be calculated; and experience shows that the average for one such large group can generally be estimated as the average for a prior such large group manufactured at the same plant, near the same time, by substantially the same process.

As an example, for a manufacturing process yielding five to ten thousand solar cells a day, one might typically expect the average for any large number of cells as they are manufactured, with certain cells eliminated as indicated, to hover in the vicinity of 2.1 amperes for a number of months, but during another period of months to hover, e.g., at 1.9 amperes. This, of course, is just by way of illustration.

Returning to the forming of arrays of such solar cells, for example in constructing solar panels, for a particular array or panel design, solar cells having a test current within a range such as 0.1 ampere would conventionally be selected for the particular design. A fundamental reason for this matching is to avoid the negative effects which can occur when cells with significantly varying characteristics are employed in a single array. Concerning solar cells connected in series, the connection of solar cells having identical characteristics is the ideal situation. Then, under ideal conditions, the cells will all operate at their identical maximum power points with, as is required by the series connection, the same current passing through each cell. On the other hand, if a cell having a significantly lower voltage along its characteristic, than the other cells, at the maximum power point current for the other cells, is included in the series, the other cells will force a current through the differing cell that is significantly higher than its maximum power point current, thus moving the operating point of the differing cell to a significantly lower voltage than at its maximum power point. In an extreme case, the voltage could become a voltage with a different polarity than for the other cells. This situation causes a power output for the total series connection that is below the ideal.

The present invention provides a fabrication process for solar to electrical energy conversion units which permits the effective utilization of a wide distribution of solar cells while, at the same time, fabricating units having a high degree of uniformity of operating characteristics. It accomplishes this through the categorization of the cells and the formation of arrays of the cells which take rather specific, but varying forms.

SUMMARY OF THE INVENTION

In accordance with the invention, a process for fabricating solar to electrical energy conversion units includes the steps of: providing a group of solar cells having a distribution of cell currents for a set cell voltage, a set level of incident solar cell face radiation and a set temperature, wherein each of such solar cells is capable of classification into one of a number of categories, and each of such categories is defined by a range of cell currents at substantially such set conditions which is different than the range for each other category and which can be characterized by a selected cell current level in such range for such category; selecting a goal array current range for a number of arrays of solar cells; and, for each of the arrays, forming parallel-connected strings of series-connected cells from cells in a plurality of the categories, wherein each string in the array consists of cells from a single category, has the same number of cells as each other string in the array and can be characterized by the selected cell current level for the relevant category, and wherein the array has such characterizing currents for the parallel-connected strings which sum to a level within the selected goal array current range for the arrays.

In accordance with additional aspects, the fabricating process includes the additional steps of: manufacturing the group of solar cells; and establishing, e.g., by estimating prior to such manufacturing, at least an approximate average current for the group of solar cells at the set conditions; wherein each of the arrays consists of the same number of parallel strings of solar cells and that number times such established current equals a current level which falls within the goal array current range.

In accordance with other additional aspects, a fabricating process as initially described, includes the additional steps of: constructing a number of solar panels, each including one of such initially described arrays; and connecting a plurality of such panels in series.

In an illustrative embodiment, a group of manufactured solar cells has test currents falling in a range of from 1.5 to 2.4 amperes. Such cells are classified into nine test current range categories of equal size (0.1 ampere); the established average test current for the group of solar cells is 2.16 amperes; a goal array current range of 12.95 amperes plus or minus 2.2 percent is selected; and arrays of six parallel-connected strings of eleven series-connected solar cells are formed and are each included in a solar panel. Hundreds of combinations of strings, characterized by the category of their cells, are possible for the selected goal array current range. In addition, combinations with strings from very disparate categories are provided, e.g., with strings selected from both the lowest and the highest category. In this respect, arrays are provided having a current range for the category for one string which consists of currents which each differ from each current in the current range for the category for another string by equal to or greater than about eight percent of each current in the current range for the category for such other string.

As will be apparent from the description that follows, a variety of embodiments differing in various ways from the illustrative embodiment can be readily provided. Just as one alternative example, the size of the current range categories might be chosen to be 0.05 ampere, the solar panel might be chosen to have arrays of three parallel-connected strings of five series-connected solar cells, and other compatible changes might be made in providing a different embodiment.

DETAILED DESCRIPTION

Figure 1A:
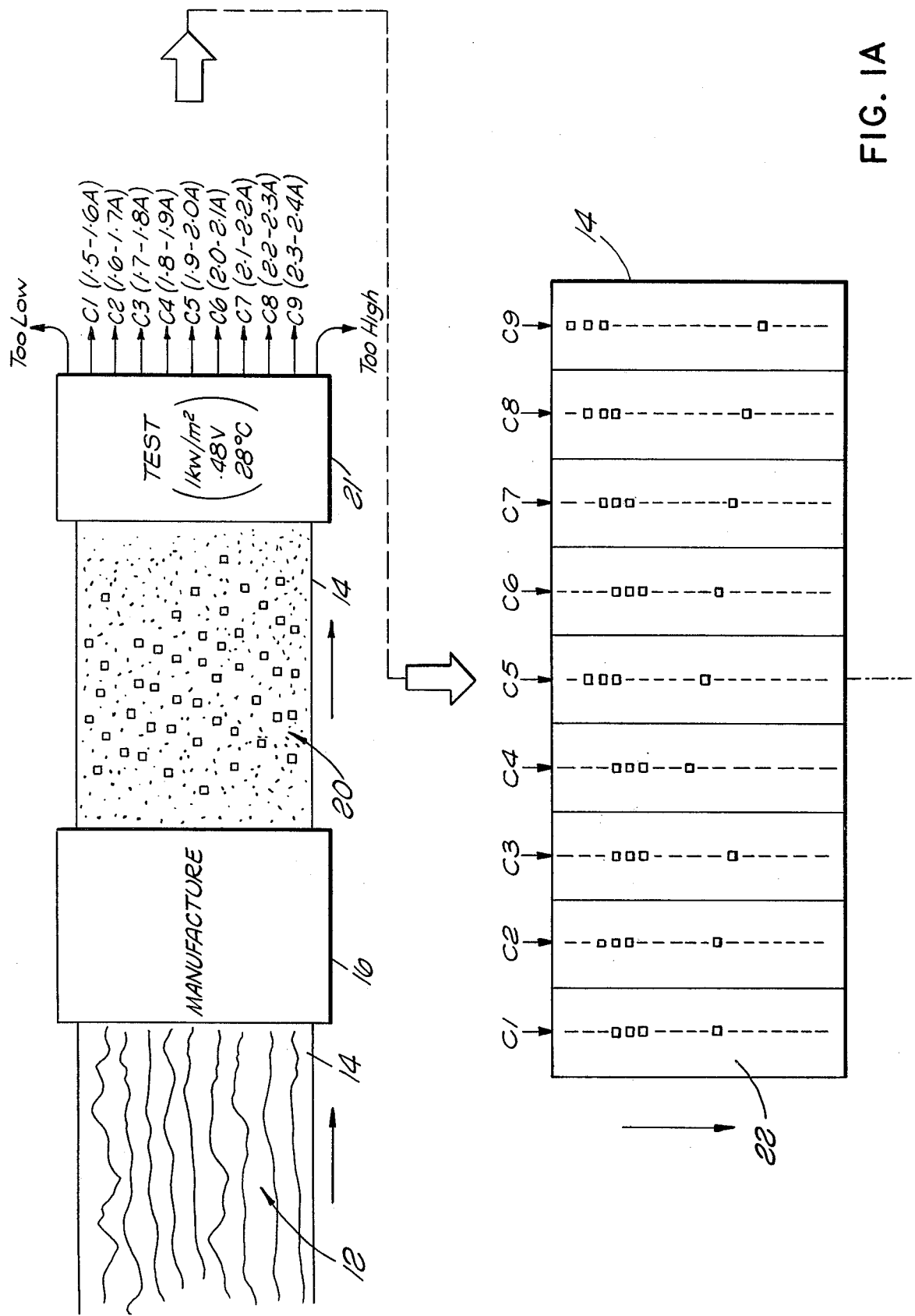
FIGS. 1A–C show, in substantially schematic form, an illustrative process for fabricating solar to electrical energy conversion units in accordance with the invention.
Figure 1B:
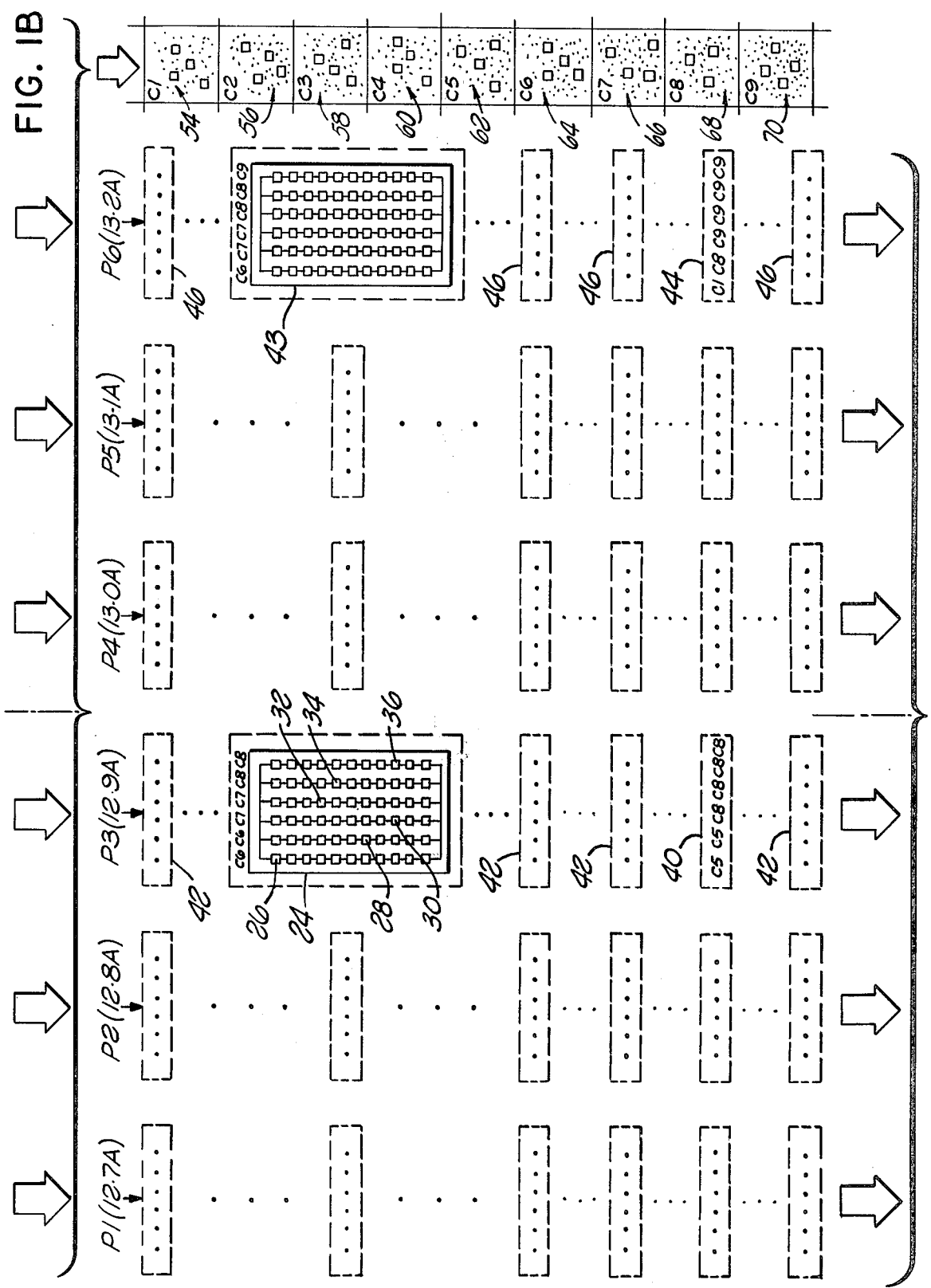
Figure 1C:
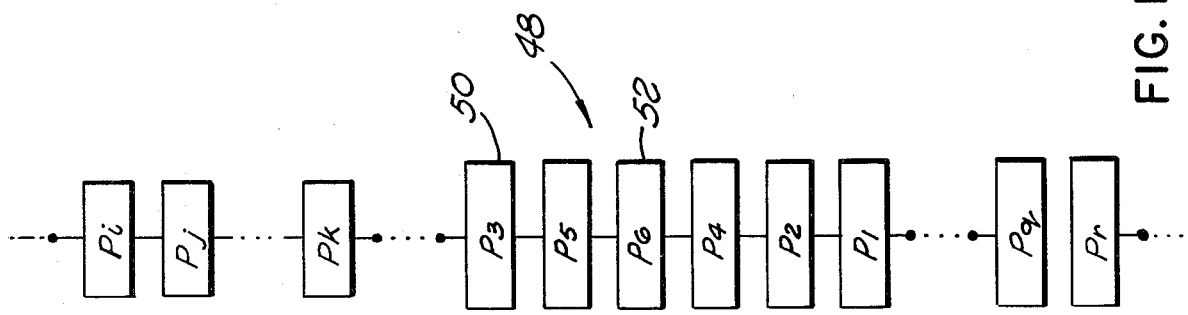

A detailed illustrative process for fabricating solar to electrical energy conversion units is shown, substantially in schematic form, in FIGS. 1A–C. Specific assumptions are made with respect to the particular illustrative process as shown in FIGS. 1A–C and described herein. However, it should be apparent that a number of these assumptions are made solely for clarity of description and ease of understanding, and to provide a detailed basis for the claims herein which define the scope of the present invention.

Referring summarily to FIGS. 1A–C, the figures show the manufacturing of a large number of solar cells; the testing of the current of each of such cells at a set level of solar radiation incident on the face of the cell and a set temperature, and with a set voltage applied across the cell; the discarding, for purposes of the remainder of the process, of cells which test below a certain minimum current level and of cells which test at a level so high as to make the cells so atypical that they are not adapted for potential utilization in the remainder of the process; the categorization of the remaining cells into nine test current ranges covering about 0.1 ampere each; the constructing, with solar cells from among the remaining cells, of six different forms of solar panels, each including, as the solar to electrical energy conversion portion thereof, an array of six parallel-connected strings of eleven series-connected solar cells, with each string consisting of cells from the same category but with differences in category occurring between strings; the connection of various of the forms of panel in series to form completed conversion units; along with the saving of categorized spare cells not used in the particular group of panels constructed and units fabricated from such panels.

The six forms of solar panel are characterized by the sum of the currents in the middle of the ranges for the categories from which the strings in each array for that form are selected. Thus, the current level which is selected to characterize the range for the first category of cells C1 is 1.55 amperes; the current level which is selected to characterize the range for the second category C2 is 1.65 amperes, etc. Further, the sum of the characterizing currents for the cell categories for the six strings in the panels belonging to the first form of panel P1 is 12.7 amperes; such sum for the second form of panel P2 is 12.8 amperes, etc. That panel forms having such sums of 12.7 amperes, 12.8 amperes, 12.9 amperes, 13.0 amperes, 13.1 amperes, and 13.2 amperes are acceptable, is determined by a decision selecting a goal array current for the array in each solar panel of 12.95 amperes plus or minus 2.2 percent. In accordance with this, the characterizing current sum, as explained above, for the arrays in each form of panel, is required to be within 12.95 amperes plus or minus 2.2 percent.

Finishing the above summary treatment of the process, it should be evident that the process for constructing the six different forms of arrays of parallel-connected strings of series-connected cells carries with it a process for constructing standardized arrays from a distribution of manufactured solar cells, wherein such arrays may all be characterized by the designation 12.95 amperes plus or minus 2.2 percent, which designation defines to the users of these arrays, the foregoing requirements for fabricating the arrays and, through such requirements, the expected performance of the arrays.

Now turning to a more detailed description of the process of FIGS. 1A–C and more specially to FIG. 1A, the manufacturing of the solar cells is schematically represented by the passing of materials 12 used in manufacturing solar cells on a conveyor belt 14 through a manufacturing block 16, and the appearance of the resulting large number of candidate solar cells 20 for prospective inclusion in the standardized solar panels which are to be manufactured. Such manufacturing of solar cells is wholly conventional; and the details thereof play no part in the invention.

Thus, the candidate solar cells 20 of FIG. 1A, which, in the particular process of FIGS. 1A–C, are P/N junction solar cells, are manufactured according to well-known, standard techniques. Such techniques, which are well understood by those skilled in the art, as major steps, include: the growing of a semiconductor ingot of one conductivity type (e.g., P-type); the shaping of the ingot by grinding; the slicing of thin wafers from the ingot; the removal of the cutting damage from the wafers by chemical treatment; the formation of regions of a conductivity type opposite to that of the original ingot (e.g., N-type) by diffusion and of P/N junctions in the wafers; further chemical treatment, including etching to remove unwanted material; and the application of front and back contacts, the front contacts being shaped to extend to various portions of the front of the solar cell and at the same time to leave large areas uncovered and, thus, open to solar radiation.

In FIG. 1A, the solar cells are assumed to be the yield of many thousands of cells (e.g., of the order of 25,000) for three days of production of a manufacturing facility capable of producing of the order of five to ten thousand cells of a given type per day. In particular, they are assumed to be 3.6 by 3.6 inch (9.15 by 9.15 centimeter) standardized, square solar cells manufactured by a conventional process of the type discussed above.

Figure 4:
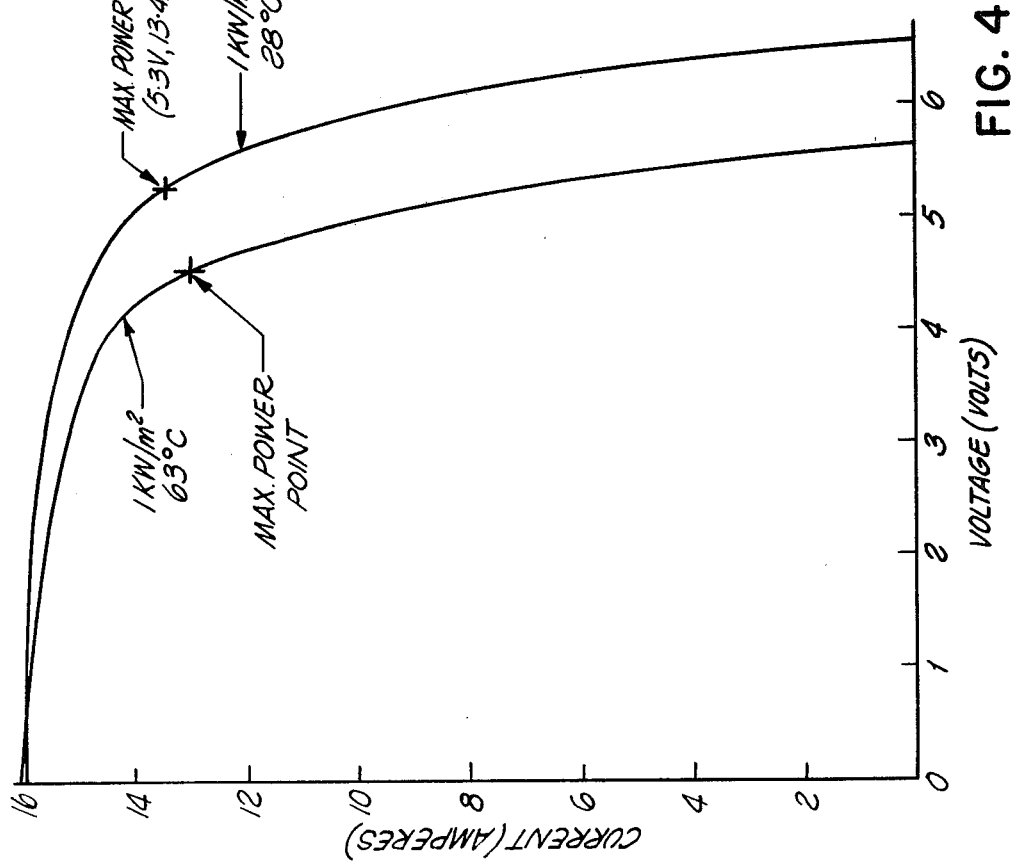
FIG. 4 is an illustrative current versus voltage characteristic for a solar panel, which is useful in understanding the process of FIGS. 1A–C.

Voltage versus current characteristics for a hypothetical expected solar cell of this type for the plant, at a level of incident solar radiation on the cell face of 1 kilowatt/(meter)$^2$ at temperatures of 28 degrees centigrade (about room temperature) and 63 degrees centigrade, are shown in FIG. 4. As indicated, the maximum power point for the cell at such level of radiation at 28 degrees centigrade is found at a cell voltage of 0.48 volts and a cell current of 2.16 amperes.

The conventional technique for testing solar cells, such as the candidate cells 20, is to test the current output of each such cell at an applied cell voltage which is at or near the expected maximum power voltage for the cell, at a set level of solar radiation incident on the cell face, when the cell is in an environment at a given temperature. Twenty-eight degrees centigrade (which approximates room temperature) is a typical temperature that is employed, and 1 kilowatt/(meter)$^2$, which is a standardized unit of insolation (rate of receipt of direct solar energy per unit area perpendicular to the direction of the energy) known as 1 "sun", is a typical insolation level that is employed, for testing the expected performance of solar cells and for comparing solar cells.

In the process illustrated in FIGS. 1A-C, and referring specifically to FIG. 1A, the candidate solar cells 20 are each tested at 28 degrees centigrade and 1 kilowatt/(meter)$^2$ for an applied voltage across the cell of 0.48 volts (which is the voltage at the maximum power point for the hypothetical expected cell). Such testing is accomplished by the application of a voltage across the front and back contacts of the cell by a power source, the generation by conventional instrumentation of 1 kilowatt/(meter)$^2$ of radiation with a spectrum which substantially mimics the solar radiation spectrum, the positioning of the cell so its face is perpendicular to the incident direction of the generated radiation, the maintaining of the ambient temperature in the testing environment at 28 degrees centigrade, and the measurement of the current output of the cell under these conditions. Such testing is represented by the movement of the cells on the conveyor belt 14 into a test block 21 in FIG. 1A.

As further indicated, cells which have a current for these conditions of under 1.5 amperes are eliminated as being not appropriate for further inclusion in the remainder of the process. In addition, cells having a test current of over 2.4 amperes are eliminated as being so atypical and unexpected as to not be appropriate for inclusion. It should however be noted that, in a typical situation, the occurrence of cells with test currents in the range from 2.3 to 2.4 amperes (the 9th cell category) may well be common while cells approaching a test current of 2.4 amperes may well never occur. In such a situation, no elimination of cells at the high end would be required.

Still referring to FIG. 1A, the cells which are not eliminated at the high or the low end are classified into nine categories of cells, categories C1 through C9, respectively.

The category designations and respective range of test currents covered are as follows: (1) C1—1.5 to 1.6 amperes; (2) C2—1.6 to 1.7 amperes; (3) C3—1.7 to 1.8 amperes; (4) C4—1.8 to 1.9 amperes; (5) C5—1.9 to 2.0 amperes; (6) C6—2.0 to 2.1 amperes; (7) C7—2.1 to 2.2 amperes; (8) C8—2.2 to 2.3 amperes; (9) C9—2.3 to 2.4 amperes. In classifying cells, rounding would typically occur. For example, the first class C1 might well cover 1.495 through 1.594 amperes, with the subsequent classes covering corresponding ranges. This in fact, will be assumed to be the situation for the process of FIGS. 1A-C.

Figure 2:
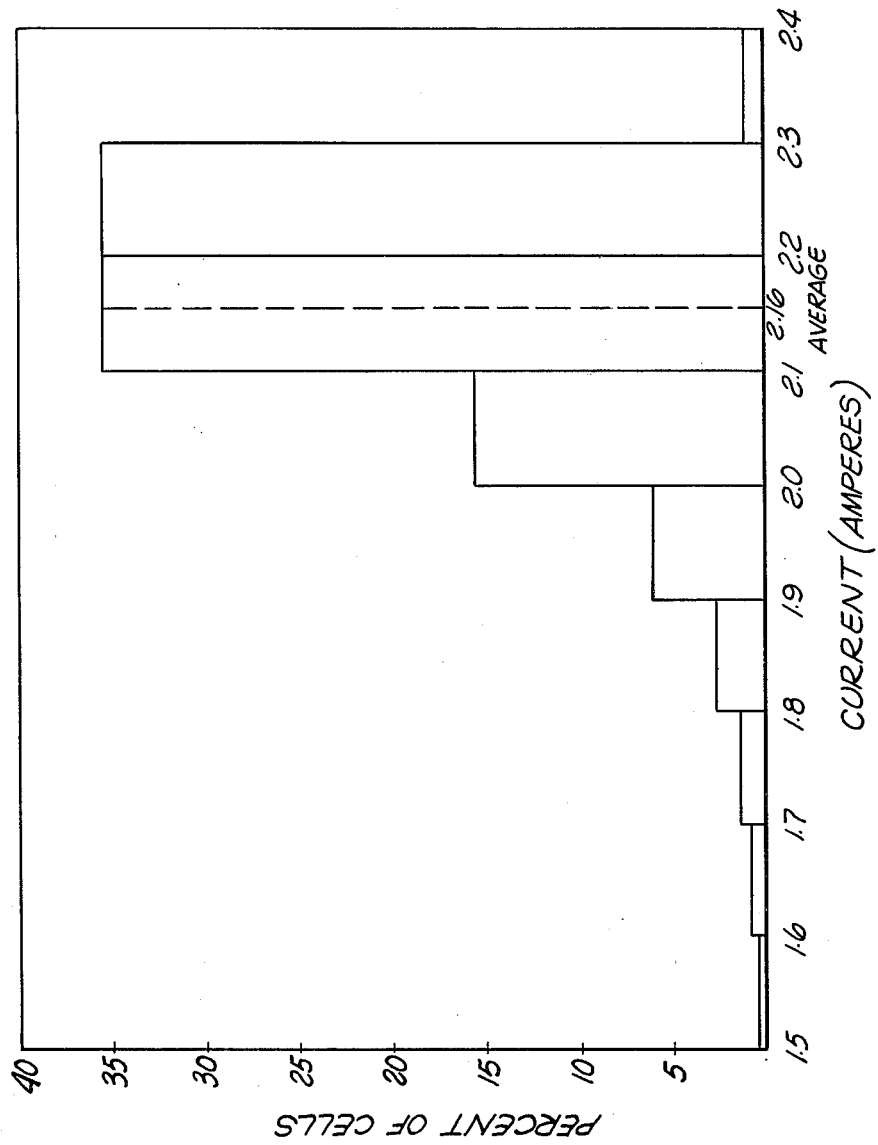
FIG. 2 is a graph showing a test current distribution for a group of solar cells in the illustrative process of FIGS. 1A–C.

For all of the cells of the candidate group of cells 20 which are classified in the categories C1 through C9, the percent of such categorized cells in each category is graphically represented in FIG. 2. This, of course, is a hypothetical illustrative distribution; however, it in fact is a realistic distribution for the particular assumptions made herein. At any rate, it will be apparent that the principles applied herein can be readily adapted to distributions other than the illustrative distribution of FIG. 2. As is also indicated in FIG. 2, the average test current for these cells is 2.16 amperes (which is the current at the maximum power point for the hypothetical expected cell of FIG. 3). (For convenience of description and ease of understanding, a rounding of this average to three places is assumed.)

With respect to such distribution and average, based on empirical experience, for substantially the same plant equipment, the same materials and the same conditions, the expected distribution of test currents and the average test current for large numbers of cells produced rather close in time and from which cells are eliminated in identical fashion at the high and low end, can be expected to generally vary in only relatively minor respects. Therefore, it will be appreciated that rather than establishing a tested distribution and a tested average in the manner indicated above, the distribution and average might, as an alternative, be estimated prior to the manufacture of the candidate cells 20 based on past, recent experience for the plant.

Carrying this one step further, the distribution of test currents and the average test current for any sufficiently large number of cells coming out of the test block 21 in FIG. 1A and within the determined categories might then, as well, be relatively accurately estimated based on past recent experience.

By reference to the above, it will be apparent that empirical experience thus typically permits one to estimate at least an approximate distribution of test currents and an approximate average test current for large groups of solar cells such as the categorized cells of FIG. 1A based on past experience.

Now continuing with the remainder of the process illustrated in FIGS. 1A-C, the continuation of the process and the separation of the non-eliminated cells by categories is schematically represented by the nine tracks 22, labelled by the cell category, along the continuation of the conveyor belt 14 of FIG. 1A. In the illustrative process of FIG. 1, all of the categorized cells from the original manufactured group 20 are present on the tracks of the drawing. As illustrated by the next stage of FIGS. 1A-C, these cells are used to form arrays of six parallel-connected strings of eleven-series connected solar cells, wherein each string of eleven cells consists only of cells from one category, but strings of cells from different categories occur in the same array.

Figure 3:
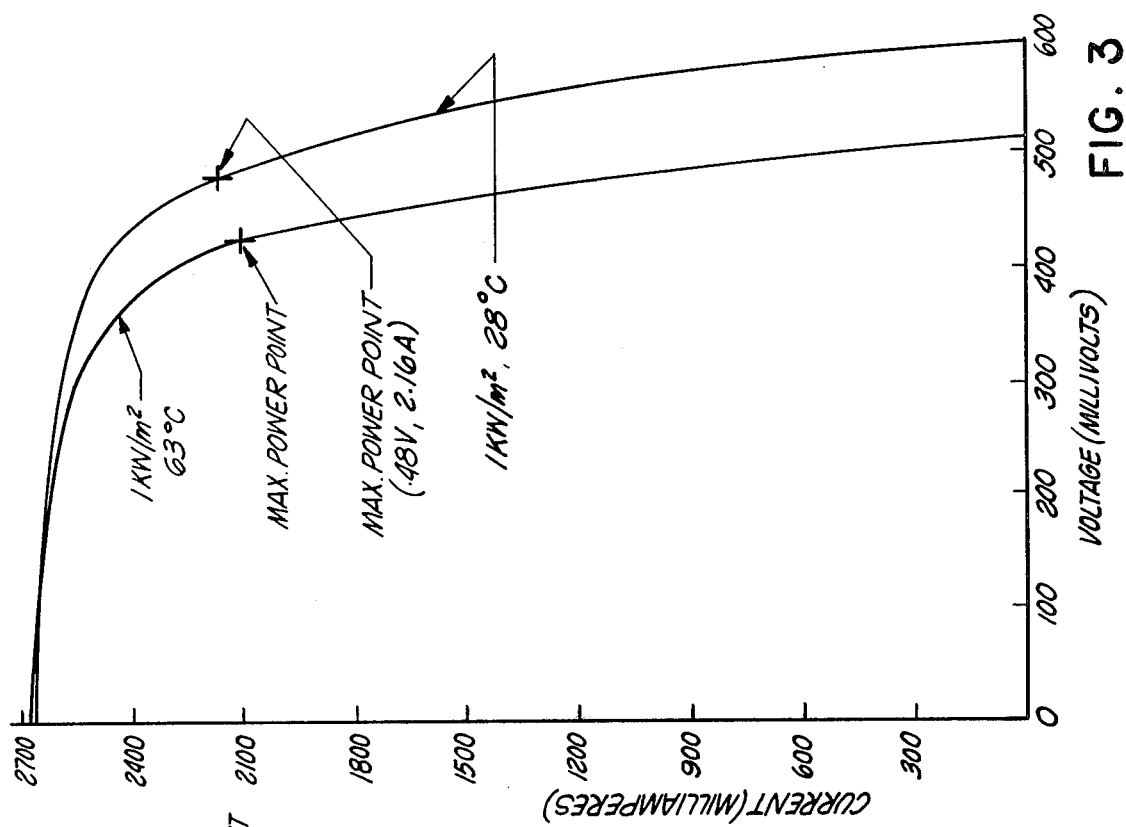
FIG. 3 is an illustrative current versus voltage characteristic for a solar cell, which is useful in understanding the process of FIGS. 1A–C.

The reason for matching the series-connected cells in each string by category may be well appreciated by reference to FIG. 3. A series connection, of course, causes each cell in series to pass the same amount of current. Assuming, for purposes of illustration, that ten cells in a string are perfectly matched with the characteristics of FIG. 3 and are operating near their maximum power points at 1 kilowatt/(meter)$^2$ and 28 degrees centigrade, and that a single cell in the series, due to its differing characteristics, must operate at a substantially lower voltage than the maximum power point voltage of the other cells to approach the current of the other cells, that cell will have a much lower voltage than is otherwise desirable. Therefore, the power output of that cell and of the whole string, as a result of the unmatched situation, will be lower than would be desirable. In fact, it is possible that the voltage of the unmatched cell could be forced into the second quadrant of that cell's current versus voltage characteristic in order to approach the current of the other cells. In that case, the unmatched cell would be an energy absorber, dissipating energy generated by the other cells, rather than an energy source.

With reference to FIG. 3, it might be mentioned that, as is somewhat traditional with solar cells, a positive current of course is defined as a current leaving the contact of the solar cell having the positive polarity, and the curves of FIG. 3 of course continue into the second quadrant.

The classification of the six-by-eleven arrays, and thereby of the solar panels of FIG. 1B into which they are incorporated as the source of electrical energy, and the choice of cell categories for the strings in the various arrays, will now be explained in detail.

Initially, a goal array current range, already briefly adverted to, for the arrays is established by multiplying the average current for the distribution of FIG. 2 times the number of strings which will be used in each array, the number 6. This yields a goal array current of 12.95 amperes. (Note that the 2.16 ampere average given in FIG. 2 is assumed rounded to three places, while this goal array current is then, in accordance with this, assumed to be calculated from a somewhat more precise average.) A reasonable range about this goal array current of 2.2 percent is then determined. This number is a reasonable choice for the illustrative process of FIG. 1. In addition, a characteristic current for each solar cell category is selected. In the present case, as also was already adverted to, the selections are the following: (1) for C1—1.55 amperes; (2) for C2—1.65 amperes; for C3—1.75 amperes; for C4—1.85 amperes; for C5—1.95 amperes; for C6—2.05 amperes; for C7—2.15 amperes; for C8—2.25 amperes; and for C9—2.35 amperes. Then, the numbers to which the various combinations of six of the characteristic currents (representative of six strings in parallel) sum, which fall within 12.95 amperes plus or minus 2.2 percent are determined. These numbers, which are 12.7, 12.8, 12.9, 13.0, 13.1 and 13.2, the above procedure, and the number of string combinations which are possible for each of such numbers, are represented in the following chart:

| 12.7 | | 71 | |
|------|------------|----|----------------|
| 12.8 | | 59 | |
| 12.9 | | 51 | |
| 13.0 | 12.95 ± 2.2% | 40 | 279 combinations |
| 13.1 | | 33 | |
| 13.2 | | 25 | |

Thus, the six forms of arrays and, thus, of solar panels into which such arrays are incorporated, are designated by the six numbers (current values) at the left of the chart. Further, to form an array of each form (and solar panel incorporating such array), any of the combinations of six parallel-connected strings of eleven series-connected cells wherein the characteristic currents for the categories from which the cells in each string are selected sum to the designated value for that array form, may be used.

This procedure thus provides a large number of ways to form each of the six classes of arrays and solar panels. It further provides great flexibility in the fabrication of a relatively standardized array encompassing all of the six forms while efficiently utilizing the output of a solar cell manufacturing process. In this regard, the selection as the goal array current of a current equalling the number of parallel strings for the arrays multiplied by the average test current for the distribution of FIG. 2 is a procedure which permits one to approach full utilization of the categorized cells while producing standardized arrays and solar panels. This is considered to be a significant efficiency, particularly given the great expense of solar cells and, due to this expense, the need to achieve efficient utilization thereof.

In accordance with the above, in FIG. 1B, completed solar panels of the six different forms are schematically represented as being made. For each form, any given solar panel may have any one of the string combinations applicable to that form. Each large or small box within a dashed line represents such a solar panel. For the third category of panels P3, with the 12.9-ampere designation, one panel is shown in with its array of solar cells also schematically shown in the drawing. That P3 panel 24 has: (1) a left string 26 consisting of eleven series-connected solar cells selected from the C6 category of solar cells; (2) a left, intermediate string 28 consisting of eleven series-connected solar cells from that same C6 category; (3) a left, center string 30 consisting of eleven series-connected solar cells from the C7 category; (4) a right, center string 32 consisting of eleven series-connected solar cells from that same C7 category; (5) a right, intermediate string 34 consisting of eleven series-connected solar cells selected from the C8 category; and (6) a right string 36 consisting of eleven series-connected solar cells from that same C8 category. Each of these strings are connected in parallel with one another to provide an array of six parallel-connected strings of eleven series-connected solar cells; and this array is incorporated into the P3 panel 24.

With regard to the usage of the term "combination" above, as is conventionally the case, a single combination, by way of example, is considered to cover the P3 panel 24 specifically shown and all other P3 panels utilizing two strings consisting of cells from each of the categories C6, C7 and C8 of solar cells.

Another P3 panel 40 is schematically shown in somewhat less detail in FIG. 1B. As is apparent from the figure, this panel incorporates an array of six parallel-connected strings of eleven series-connected solar cells, wherein the two left-most strings each consist of cells from the C5 category and the four right-most strings each consist of cells from the C8 category.

The various other dashed boxes 42 representing solar panels of the P3 type may be of any form satisfying the criteria for that class. Further, the dots between the various dashed boxes represent other such panels satisfying the criteria for that class.

The same conventions are used with respect to the rather detailed schematic representation of a particular P6 panel 43, a less detailed representation of a particular P6 panel 44 and yet less detailed schematic representations of other P6 type panels in FIG. 1B. Thus, the P6 panel 43 represented in rather substantial detail has six parallel-connected strings of eleven series-connected solar cells, wherein the strings consist of solar cells from cell categories as follows: (1) one string—C6; (2) two strings—C7; (3) two strings—C8; and (4) one string—C9. Similarly, the panel 44 of this type represented in less detail has strings from cell categories as follows: (1) one string—C1; (2) one string—C8; and (3) four strings—C9.

In addition, the various other dashed boxes 46 representing P6 type solar panels may be of any form satisfying the criteria for that class; and the dots between the various dashed boxes represent other such panels satisfying the criteria for that class.

The same conventions as for the P3 and P6 panels are used in representing the production of solar panels in the four remaining classes: P1, P2, P4 and P5.

Beyond the single solar panels in FIG. 1B, the connection of each such panel into one of a group of solar to electrical energy conversion units is represented. (Thus, for ease of understanding and convenience of description, it is assumed that each solar panel in the group of panels of FIG. 1B, as described above, is included in a conversion unit of the group of conversion units of FIG. 1C, as described below.) As indicated, each such unit employs a series connection of two or more solar panels selected from the group of solar panels described immediately above. In this regard, it is noteworthy that, in connecting unmatched solar panels in series, the corresponding problem to that encountered in connecting unmatched solar cells in series occurs. However, the six forms of solar panel of FIG. 1B, within reasonable standards, in fact may be considered matched panels, and are so considered in the process of FIGS. 1A-C. In accordance with this, as is indicated in FIG. 1C, the strings of panels connected in series are of varying length, and, in general, any panel in any string may be of any of the six forms P1 through P6. In accordance with this, "P" followed by a letter, e.g., "i", in FIG. 1C, means a panel which can arbitrarily be of any of the types P1 through P6. Thus, in FIG. 1C, a solar to electrical conversion energy unit 48 specified in the most detail incorporates six of the solar panels connected in series, wherein one panel taking each of the six possible forms is present. By way of example, the P3 panel 50 in the series may be a panel such as the P3 panel 24 represented in substantial detail in FIG. 1B; and the P6 panel 52 may be a panel such as the P6 panel 43 also represented in substantial detail in FIG. 1B.

The other two units specifically represented in FIG. 1C, as indicated, have two or more solar panels (in fact two in one case and more than three in the other), each panel being of an arbitrary one of the six forms. The groups of dots between the solar panels in one of these two units of course indicates one or more other solar panels in series. Similarly, the groups of dots after units indicates other units of series-connected panels having two or more panels, wherein any given panel may be of any given one of the six forms.

It will be appreciated by those skilled in the art that more complex units having parallel-connected strings of series-connected solar panels could, if desired, readily be formed using arbitrarily selected solar panels from among the six forms for any given panel. Each such array, of course, would have an equal number of series-connected solar panels in its strings.

With respect to the construction of the solar panels of FIG. 1B and the classification of such panels and of the arrays included therein, several additional considerations should be noted.

The solar panels of FIG. 1B, of course, can be of any conventional type. At the simplest level, they may merely consist of the arrays mounted so as to be supported and also protected from the environmental conditions. On a more complex level, many conventional solar panels incorporate a solar cell array encapsulated in a layer of material which in turn is sandwiched between layers of other materials. A typical example is a panel having a face layer of glass, having a solar cell array encapsulated in a polyvinyl butyral formulation, and having a back layer formed of a polyvinyl fluoride formulation. Such laminated panels are conventionally formed using vacuum lamination techniques in connection with the application of heat.

With reference to the more complex panels, it is often the case that when a solar cell is in the formed panel, its effective voltage versus current characteristic is enhanced. Thus, for a certain level of solar radiation perpendicularly incident on the panel face, such as 1 kilowatt/(meter)$^2$, at a given environmental temperature, such as 28 degrees centigrade, and a given cell voltage, such as 0.48 volts, the current of the cell would be greater than for the same radiation level incident on the cell face at the same temperature and voltage, when the cell is not in the panel. One factor which typically results in such enhancement is the encapsulation of the solar cell and the positive effects resulting from the index of refraction of the encapsulating material. Thus, the disposition of an encapsulating material, due to considerations of matching of indices of refraction, often results in the enhanced performance.

Effects such as the above can typically be accounted for by a multiplying factor. Along these lines, a solar cell having a test current, determined as explained in detail above, for many typical manufacturing processes and conventional solar panels, will be found to have a test current, similarly determined, but when in a panel and based upon the level of solar radiation incident on the panel, which is the test current determined as above multiplied by a given factor. A typical factor of this sort is 1.035.

Assuming such a situation, for arrays which are classified as in FIG. 1B and to which the chart presented and described above applies, modified designations for the six forms of solar panels and a modified chart for such solar panels may conveniently be utilized. In accordance with this, the 12.7-ampere value applicable to the first form would be 12.7 amperes multiplied by 1.035, or 13.1445 amperes. Similarly, the ampere designation for each of the other forms would be modified by carrying out the multiplication by 1.035. Also, the goal current applicable to the constructed solar panels would be modified by multiplying the 12.95 ampere goal array current times 1.035, to specify a goal panel current of 13.4 amperes.

Then, with a goal panel current range of 13.4 plus or minus 2.2%, the above chart which would still be applicable to the six forms of arrays, for the constructed panels, would be modified to read as follows:

| | | | |
|---|---|---|---|
| 13.1445 | | 71 | |
| 13.248 | | 59 | |
| 13.3515 | | 51 | |
| 13.455 | 13.4 ± 2.2% | 40 | 279 combinations |
| 13.5585 | | 33 | |
| 13.662 | | 25 | |

Voltage versus current characteristics for a hypothetical expected solar panel formed according to the process of FIGS. 1A-C with the 1.035 effect factored in are shown in FIG. 3. Two characteristics are shown, each at 1 kilowatt/(meter)$^2$ of solar radiation perpendicularly incident on the face of the panel, but at different temperatures of 28 degrees centigrade and 63 degrees centigrade. Focusing on the curve for 28 degrees centigrade, the 5.3-volt maximum power point voltage is the 0.48-volt maximum power point voltage for the hypothetical expected cell of FIG. 3, multiplied by 11, for the 11 cells in series per string. Similarly, the 13.4-ampere current at the maximum power point is the 2.16-ampere current at the maximum power point for the hypothetical expected cell multiplied by a factor which equals 6 multiplied by 1.035, the 6 for the number of strings, and the 1.035 for the effects of the incorporation of the solar cells in solar panels.

One aspect of FIGS. 1A–C has, to this point, not been explicitly referred to. That is the portion of FIG. 1B which shows a number of categorized spare cells of each category which are not used in the arrays, solar panels and conversion units of FIGS. 1B and C. Although the process of FIGS. 1A–C, and in particular the relationship of the average test current for the categorized solar cells, the number of strings of solar cells in the arrays and the goal array current, is intended to achieve efficient utilization of the categorized solar cells, it is unlikely that any specific process in accordance with FIGS. 1A–C and the description herein will achieve the utilization of each categorized solar cell. In keeping with this, in the particular process of FIGS. 1A–C, it is assumed that some number of cells in each category are left over, e.g., for subsequent use. Thus spare cells for the respective categories C1 through C9, designated at 54, 56, 58, 60, 62, 64, 66, 68 and 70, respectively, are shown.

Along similar lines, it should be apparent that a particularly practical variation on the process of FIGS. 1A–C would call for the utilization of an estimated average test current for any large number of categorized solar cells, determined in a fashion explained previously, and of an assembly-line fabrication process in which the manufacturing of solar cells and the other steps, through the fabrication of the completed conversion units, are carried out simultaneously, without the need to explicitly circumscribe any particular groups of solar cells, panels or conversion units as the assembly-line process occurs.

In view of the above description, it may be seen that the process for fabricating solar to electrical energy conversion units may be variously implemented and variously used depending upon specific situations and applications. Accordingly, many modifications and variations may be made without departing from the scope or spirit of the invention.

What is claimed is:

1. A process for fabricating solar to electrical energy conversion units, comprising the steps of:
   providing a group of solar cells having a distribution of cell currents for a set cell voltage, a set level of incident solar cell face radiation and a set temperature, each of said solar cells being capable of classification into one of a number of categories, each of said categories being defined by a range of cell currents at substantially said set cell voltage, level of incident solar cell face radiation and temperature which is different than said range for each other category, and being characterizable by a selected cell current level in said range for said category;
   selecting a goal array current range for a number of arrays of solar cells;
   for each said array, forming parallel-connected strings of series-connected solar cells from a plurality of said categories, each string in said array consisting of cells from a single category, having the same number of cells as each other string in said array and being characterizable by said selected cell current level for said category, said array having characterizable currents for said parallel-connected strings which sum to a level within said selected goal array current range for said arrays.

2. A fabricating process as defined in claim 1 including the additional step of establishing at least an approximate average current for said group of solar cells at said set cell voltage, level of incident solar cell face radiation and temperature, wherein:
   each of said arrays consists of the same number of parallel strings of solar cells and said number times said established current equals a current level which falls within said goal array current range.

3. A fabricating process as defined in claim 2 including the additional step of manufacturing said group of solar cells, wherein:
   said establishing step comprises estimating said at least approximate average current prior to said manufacturing step.

4. A fabricating process as defined in claim 1 wherein each of said arrays consists of at least three strings of cells, said cells for each of said strings being from a different said category.

5. A fabricating process as defined in claim 4 wherein each of said strings for each of said arrays consists of at least five series-connected solar cells.

6. A fabricating process as defined in claim 1 wherein each of said arrays consists of at least six said strings, said cells for at least three of said strings being from different said categories.

7. A fabricating process as defined in claim 6 wherein each of said strings for each of said arrays consists of at least eleven series-connected solar cells.

8. A fabricating process as defined in claim 1 wherein said range for each of said categories is substantially non-overlapping with said range for each other category.

9. A fabricating process as defined in claim 8 wherein said range for each of said categories is equal to or greater than about 0.05 ampere.

10. A fabricating process as defined in claim 1 wherein said range for each of said categories is equal to or greater than about 0.05 ampere.

11. A fabricating process as defined in claim 1 wherein:
   for each said array, said current range for said category for one said string consists of currents which each differ from each current in said current range for said category for another said string by equal to or greater than about eight percent of each said current in said current range for said category for said another string.

12. A fabricating process as defined in claim 1 including the additional step of:
   connecting a plurality of said arrays in series.

13. A fabricating process as defined in claim 1 including the additional step of:
   constructing a number of solar panels, each of said panels including one of said arrays.

14. A fabricating process as defined in claim 13 including the additional step of:
   connecting a plurality of said solar panels in series.

* * * * *